(12) United States Patent
Kim

(10) Patent No.: US 9,190,125 B2
(45) Date of Patent: Nov. 17, 2015

(54) CLOCK GENERATION CIRCUIT AND SEMICONDUCTOR MEMORY DEVICE EMPLOYING THE SAME

(75) Inventor: Kwan-Dong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 603 days.

(21) Appl. No.: 13/606,203

(22) Filed: Sep. 7, 2012

(65) Prior Publication Data

US 2013/0163367 A1    Jun. 27, 2013

(30) Foreign Application Priority Data

Dec. 22, 2011  (KR) .................. 10-2011-0140277

(51) Int. Cl.
| | | |
|---|---|---|
| *G11C 8/00* | (2006.01) | |
| *G11C 8/18* | (2006.01) | |
| *G11C 7/10* | (2006.01) | |
| *G11C 7/22* | (2006.01) | |

(52) U.S. Cl.
CPC ............. *G11C 7/1066* (2013.01); *G11C 7/222* (2013.01)

(58) Field of Classification Search
CPC ........ G11C 7/222; G11C 7/22; G11C 7/1066; G11C 2207/2272; G11C 7/1051; G11C 7/106; G11C 7/1087; G11C 7/1093; G11C 7/109
See application file for complete search history.

(56) References Cited

U.S. PATENT DOCUMENTS

| | | | | |
|---|---|---|---|---|
| 6,509,776 | B2* | 1/2003 | Kobayashi et al. | 327/277 |
| 7,038,972 | B2* | 5/2006 | Seo et al. | 365/189.15 |
| 7,170,819 | B2* | 1/2007 | Szczypinski | 365/189.05 |
| 2009/0116313 | A1* | 5/2009 | Jang | 365/194 |

FOREIGN PATENT DOCUMENTS

| | | |
|---|---|---|
| KR | 100879781 | 1/2009 |
| KR | 1020110033915 | 4/2011 |

\* cited by examiner

*Primary Examiner* — Hien Nguyen
(74) *Attorney, Agent, or Firm* — IP & T Group LLP

(57) ABSTRACT

A semiconductor memory device includes a first internal clock generation circuit configured to generate a first internal clock by compensating an external clock signal for a transfer delay thereof in the semiconductor memory device, a control voltage generation circuit configured to generate a control voltage in response to a profile selection signal, a second internal clock generation circuit configured to generate a second internal clock signal by delaying the first internal clock signal by a time corresponding to the control voltage, a selection output circuit configured to select one of the first internal clock signal and the second internal clock signal in response to a path selection signal and output a selected signal as a synchronization clock signal, and a data output circuit configured to output a data in synchronization with the synchronization clock signal.

19 Claims, 3 Drawing Sheets

CLOCK GENERATION CIRCUIT AND SEMICONDUCTOR MEMORY DEVICE EMPLOYING THE SAME

CROSS-REFERENCE TO RELATED APPLICATIONS

The present application claims priority of Korean Patent Application No. 10-2011-0140277, filed on Dec. 22, 2011, which is incorporated herein by reference in its entirety.

BACKGROUND

1. Field

Exemplary embodiments of the present invention relate to a semiconductor designing technology, and more particularly, to a clock generation circuit for generating an internal clock signal and a semiconductor memory device employing the clock generation circuit.

2. Description of the Related Art

Generally, semiconductor memory devices including a Double Data Rate Synchronous Dynamic Random Access Memory (DDR SDRAM) device receives an external clock signal and generates an internal clock signal, and performs diverse operations based on the generated internal clock signal. Therefore, the semiconductor memory devices may include an internal clock generation circuit for generating an internal clock signal.

Semiconductor memory devices are demanded to operate faster and faster, and this causes new phenomena such as electro-magnetic interference. The electro-magnetic interference usually occurs when a highly integrated circuit operates at a fast speed, and the electro-magnetic interference causes malfunction of a circuit. The Federal Communications Commission (FCC) provides restriction on the occurrence of the electro-magnetic interference, and semiconductor memory devices are designed in conformity with the recommended value prescribed by the FCC.

The electro-magnetic interference occurs as the length of an internal line becomes as short as the wavelength of an internal clock signal. The short internal line functions as an antenna and increases the radiation of electro-magnetic wave, eventually causing electro-magnetic interference. As semiconductor memory devices operate faster, while occupying smaller areas, the electro-magnetic interference may become worse and the circuit malfunction may be serious. Therefore, it may be desirable to develop a technology for getting rid of, or alleviating the electro-magnetic interference.

SUMMARY

An exemplary embodiment of the present invention is directed to a semiconductor memory device that modulates an internal clock signal based on an operation frequency and modulates output data by using the modulated internal clock signal.

In accordance with an exemplary embodiment of the present invention, a semiconductor memory device includes a first internal clock generation circuit configured to generate a first internal clock signal by compensating an external clock signal for a transfer delay thereof in the semiconductor memory device, a control voltage generation circuit configured to generate a control voltage in response to a profile selection signal, a second internal clock generation circuit configured to generate a second internal clock signal by delaying the first internal clock signal by a time corresponding to the control voltage, a selection output circuit config- ured to select one of the first internal clock signal and the second internal clock signal in response to a path selection signal and output a selected signal as a synchronization clock signal, and a data output circuit configured to output a data in synchronization with the synchronization clock signal.

In accordance with another exemplary embodiment of the present invention, a clock generation circuit includes a control voltage generation circuit configured to generate a control voltage changing in response to a profile selection signal, and a voltage controlled delay line configured to generate an internal clock signal by delaying a reference clock signal by a time corresponding to the control voltage.

The control voltage may have a voltage level changing in response to the profile selection signal.

The semiconductor memory device in accordance with an exemplary embodiment of the present invention may decrease electro-magnetic interference both inside and outside of the semiconductor memory device by modulating an internal clock signal based on an operation frequency and modulating output data by using the modulated internal clock signal.

DETAILED DESCRIPTION

Figure 1:
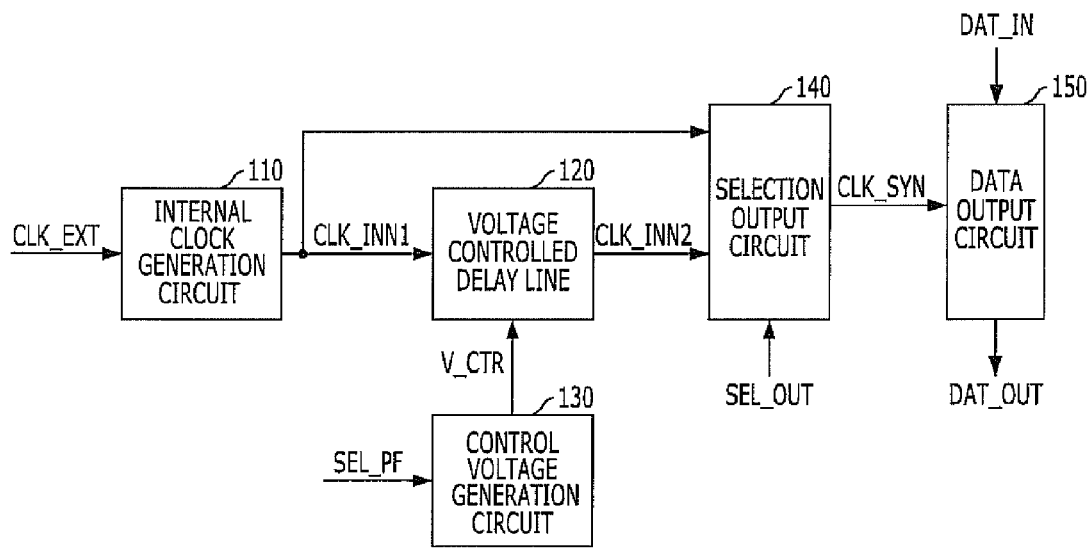
FIG. 1 is a block diagram illustrating a semiconductor memory device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor memory device in accordance with an exemplary embodiment of the present invention.

Referring to FIG. 1, the semiconductor memory device includes an internal clock generation circuit 110, a voltage controlled delay line 120, a control voltage generation circuit 130, a selection output circuit 140, and a data output circuit 150.

The internal clock generation circuit 110 receives an external clock signal CLK_EXT and generates a first internal clock signal CLK_INN1 for the synchronization in outputting a data. The internal clock generation circuit 110 may be a Delay Locked Loop (DLL) or a Phase Locked Loop (PLL). The first internal clock signal CLK_INN1 has a fixed frequency. The internal clock generation circuit 110 generate the first internal clock signal CLK_INN1 by compensating the external clock signal CLK_EXT for the transfer delay thereof in the semiconductor memory device.

The voltage controlled delay line 120 generates a second internal clock signal CLK_INN2 by reflecting a voltage level of a control voltage V_CTR into the first internal clock signal CLK_INN1. The first internal clock signal CLK_INN1 is delayed by a time corresponding to the voltage level of the control voltage V_CTR and the delayed first internal clock signal is outputted as the second internal clock signal CLK_INN2. The voltage level of the control voltage V_CTR is varied according to the time. The second internal clock signal CLK_INN2 is generated as a clock signal corresponding to a voltage level profile (profile) of the control voltage V_CTR, and this signifies that the second internal clock signal CLK_INN2 does not have a fixed frequency but a frequency corresponding to the voltage level of the control voltage V_CTR, which is described below in detail.

The control voltage generation circuit 130 generates the control voltage V_CTR having the voltage level profile determined by a profile selection signal SEL_PF. The profile of a signal may mean the waveform of the signal having a particular shape. The voltage level of control voltage V_CTR may change corresponding to the profile thereof. Meanwhile, the control voltage V_CTR according to the exemplary embodiment of the present invention may have a voltage level of various profiles, but for the sake of convenience in description, a chopping waveform of the control voltage V_CTR is described as an example. In short, the control voltage V_CTR has the voltage level profile corresponding to chopping wave.

The selection output circuit 140 selects one of the first internal clock signal CLK_INN1 and the second internal clock signal CLK_INN2 in response to a path selection signal SEL_OUT and outputs the selected signal as a synchronization clock signal CLK_SYN. The path selection signal SEL_OUT may be determined based on an operation frequency of the semiconductor memory device. In this case, the selection output circuit 140 may output the first internal clock signal CLK_INN1 as the synchronization clock signal CLK_SYN when a semiconductor memory device operates at a low frequency, and the selection output circuit 140 may output the second internal clock signal CLK_INN2 as the synchronization clock signal CLK_SYN when a semiconductor memory device operates at a high frequency.

The data output circuit 150 synchronizes an internal data DAT_IN with the synchronization clock signal CLK_SYN and outputs an external data DAT_OUT. In other words, the data output circuit 150 synchronizes the internal data DAT_IN with the first internal clock signal CLK_INN1 in a semiconductor memory device operating at a low frequency and outputs the external data DAT_OUT, and the data output circuit 150 synchronizes the internal data DAT_IN with the second internal clock signal CLK_INN2 in a semiconductor memory device operating at a high frequency and outputs the external data DAT_OUT.

Meanwhile, the voltage controlled delay line 120 consumes relatively much power. Thus, it is desirable to disable the voltage controlled delay line 120 for the duration that the second internal clock signal CLK_INN2 is not used. Another control signal may be used for this kind of control but the path selection signal SEL_OUT may be used for such control.

According to the exemplary embodiment of the present invention, when the semiconductor memory device operates at a low frequency, the internal data DAT_IN is synchronized with the first internal clock signal CLK_INN1 having a fixed frequency and the external data DAT_OUT is outputted. When the semiconductor memory device operates at a high frequency, the internal data DAT_IN is synchronized with the second internal clock signal CLK_INN2 having a frequency corresponding to the profile and the external data DAT_OUT is outputted.

Meanwhile, as described above, the semiconductor memory device operating at a high frequency synchronizes the internal data DAT_IN with the second internal clock signal CLK_INN2 having a frequency corresponding to the profile and outputs the external data DAT_OUT. In short, the external data DAT_OUT in accordance with the exemplary embodiment of the present invention is outputted at the frequency corresponding to the profile, and when the external data DAT_OUT is inputted into another circuit, the electromagnetic interference may not occur.

Figure 2:
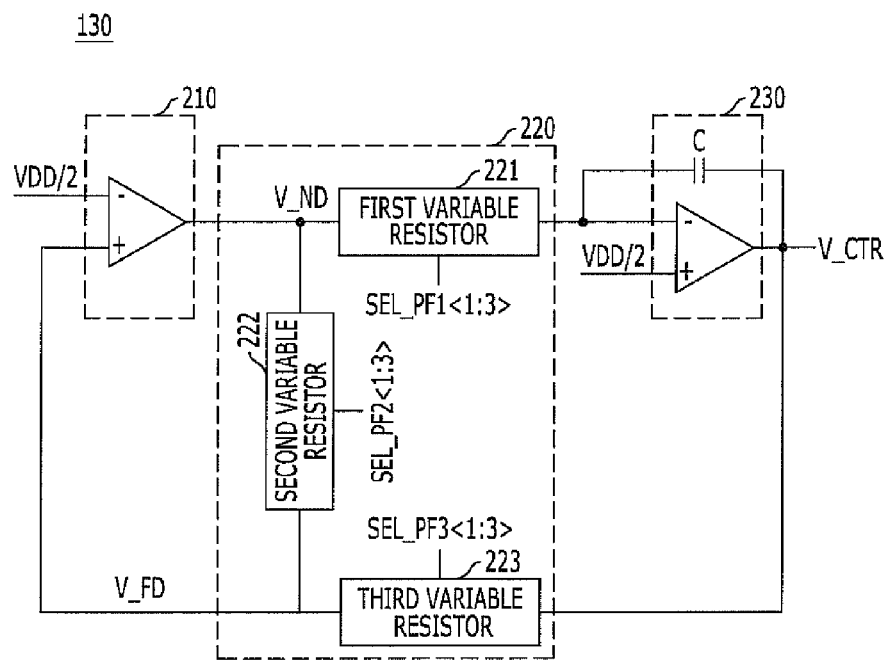
FIG. 2 is a circuit diagram illustrating a control voltage generation circuit 130 shown in FIG. 1.

FIG. 2 is a circuit diagram illustrating a control voltage generation circuit 130 shown in FIG. 1. Herein, the control voltage generation circuit 130 generates a chopping wave.

Referring to FIG. 2, the control voltage generation circuit 130 includes a feedback unit 210, a variable resistance unit 220, and an output unit 230.

The feedback unit 210 receives a feedback voltage V_FD. The feedback unit 210 compares the feedback voltage V_FD with a reference voltage VDD/2 and outputs a comparison result. The variable resistance unit 220 varies a resistance value in response to first to third profile selection signals SEL_PF1<1:3>, SEL_PF2<1:3> and SEL_PF3<1:3>. The output unit 230 outputs the control voltage V_CTR based on the resistance value of the variable resistance unit 220. The output unit 230 compares an output voltage of the variable resistance unit 220 with the reference voltage VDD/2 and outputs the result as the control voltage V_CTR.

The resistance value of the variable resistance unit 220 is determined by the first to third profile selection signals SEL_PF1<1:3>, SEL_PF2<1:3> and SEL_PF3<1:3>. Therefore, the control voltage V_CTR generated based on the resistance value of the variable resistance unit 220 has a voltage level corresponding to the profile as well.

Figure 3:
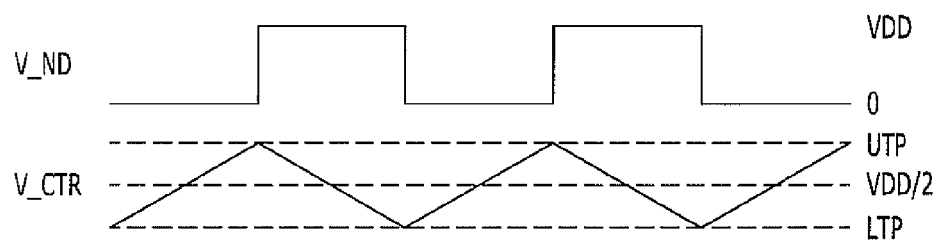
FIG. 3 is a waveform diagram illustrating an operation waveform of the control voltage generation circuit 130 shown in FIG. 2.

FIG. 3 is a waveform diagram illustrating an operation waveform of the control voltage generation circuit 130 shown in FIG. 2.

Hereinafter, the operation of the control voltage generation circuit 130 is described with reference to FIGS. 2 and 3.

In the first place, when the voltage level of a 'V_ND' node drops from 'VDD' to '0', the output unit 230 of the control voltage generation circuit 130 performs an integral calculation on a control voltage V_CTR terminal based on a time constant determined by a resistance value of a first variable resistor 221 and a capacitance value C. Therefore, the voltage level of the control voltage V_CTR is increased linearly. Conversely, when the voltage level of the 'V_ND' node surges from '0' to 'VDD', the voltage level of the control voltage V_CTR is decreased linearly.

As illustrated in FIG. 3, the control voltage V_CTR has a waveform of chopping wave swinging between the maximum voltage level UTP and the minimum voltage level LIP based on the reference voltage VDD/2. Here, the maximum voltage level UTP and the minimum voltage level LTP may be controlled by varying the resistance values of first to third variable resistors 221, 222, and 223 shown in FIG. 2.

That is, the first to third profile selection signals SEL_PF1<1:3>, SEL_PF2<1:3> and SEL_PF3<1:3> are determined according to the profile. For example, the profile of the control voltage V_CTR is controlled by adjusting the first to third profile selection signals SEL_PF1<1:3>, SEL_PF2<1:3> and SEL_PF3<1:3> in order to change an amplitude of the waveform and a frequency of the waveform.

Figure 4:
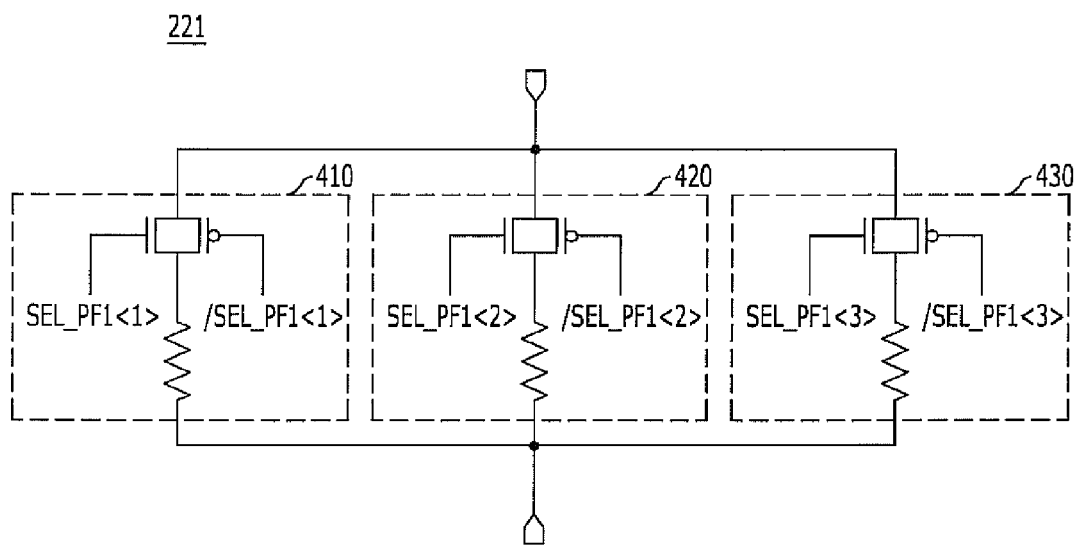
FIG. 4 is a circuit diagram illustrating first to third variable resistors 221, 222, and 223 shown in FIG. 2.

FIG. 4 is a circuit diagram illustrating the first to third variable resistors 221, 222, and 223 shown in FIG. 2. Since the first to third variable resistors 221, 222, and 223 have a similar structure, the first variable resistor 221 is representatively described here for the sake of convenience in description.

Referring to FIG. 4, the first variable resistor 221 includes first to third resistors 410, 420, and 430 whose resistance values are decided in response to the first profile selection signal SEL_PF1<1:3>.

Each of the first to third resistors 410, 420, and 430 includes a transfer gate that is turned on/off by receiving the first profile selection signal SEL_PF1<1:3> and a resistor having a set resistance value. The total resistance value of the first variable resistor 221 is controlled to diverse levels by the transfer gate that is turned on/off based on the first profile selection signal SEL_PF1<1:3>.

Therefore, the semiconductor memory device in accordance with the exemplary embodiment of the present invention may vary the maximum voltage level UTP and the minimum voltage level LTP of the chopping wave by controlling the resistance values of the first to third variable resistors 221, 222, and 223.

Figure 5:
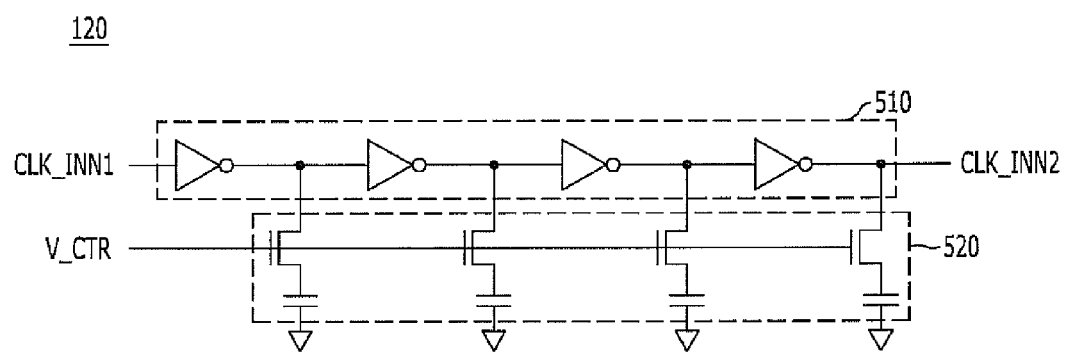
FIG. 5 is a circuit diagram illustrating a voltage controlled delay line 120 shown in FIG. 1.

FIG. 5 is a circuit diagram illustrating the voltage controlled delay line 120 shown in FIG. 1.

Referring to FIG. 5, the voltage controlled delay line 120 includes a signal transfer line 510 and a delay control unit 520. The signal transfer line 510 receives and transfers the first internal clock signal CLK_INN1 and outputs the second internal clock signal CLK_INN2. The delay control unit 520 controls a delay amount that is reflected into the signal transfer line 510 in response to the control voltage V_CTR according to the profile.

The signal transfer line 510 includes inverters coupled in series, and the delay control unit 520 includes an MOS transistor coupled between the signal transfer line 510 and a ground voltage VSS terminal to control the capacitance based on the control voltage V_CTR.

Figure 6:
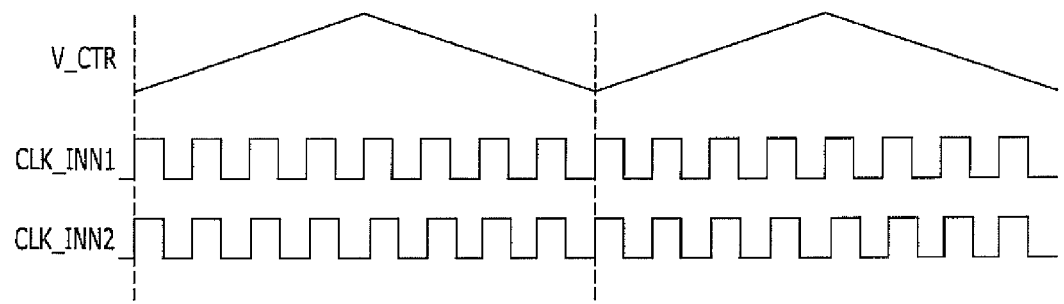
FIG. 6 is a waveform diagram illustrating a relationship between an input signal and an output signal of a voltage controlled delay line 120 shown in FIG. 5.

FIG. 6 is a waveform diagram illustrating a relationship between an input signal and an output signal of a voltage controlled delay line 120 shown in FIG. 5.

As shown in FIG. 6, when the voltage level of the control voltage V_CTR becomes large, a phase difference between the first internal clock signal CLK_INN1 and the second internal clock signal CLK_INN2 becomes large. That is, delay amount of the voltage controlled delay line 120 is increased.

When the voltage level of the control voltage V_CTR is the highest level, the phase difference between the first internal clock signal CLK_INN1 and the second internal clock signal CLK_INN2 has the peak value.

Also, when the voltage level of the control voltage V_CTR becomes small, the phase difference between the first internal clock signal CLK_INN1 and the second internal clock signal CLK_INN2 becomes small. That is, the delay amount of the voltage controlled delay line 120 is decreased.

As described above, the semiconductor memory device in accordance with the exemplary embodiment of the present invention may generate an internal clock signal having a frequency corresponding to the profile and output data by using the internal clock signal. Therefore, the internal clock signal and the data synchronized with the internal clock signal come to have a frequency corresponding to the profile instead of a fixed frequency, and the electro-magnetic interference may be reduced both inside and outside of the semiconductor memory device.

According to an exemplary embodiment of the present invention, a semiconductor memory device may prevent malfunction from being caused by electro-magnetic interference by modulating an internal clock signal of the semiconductor memory device.

While the present invention has been described with respect to the specific embodiments, it will be apparent to those skilled in the art that various changes and modifications may be made without departing from the spirit and scope of the invention as defined in the following claims.

Moreover, the logic gates and transistors illustrated in the embodiment of the present invention described above may be realized to have different positions and types depending on the polarity of an input signal.

What is claimed is:

1. A semiconductor memory device, comprising:
a first internal clock generation circuit configured to generate a first internal clock signal by compensating an external clock signal for a transfer delay thereof in the semiconductor memory device;
a control voltage generation circuit configured to generate a control voltage in response to a profile selection signal;
a second internal clock generation circuit configured to generate a second internal clock signal by delaying the first internal clock signal by a time corresponding to the control voltage;
a selection output circuit configured to select one of the first internal clock signal and the second internal clock signal in response to a path selection signal and output a selected signal as a synchronization clock signal; and
a data output circuit configured to output a data in synchronization with the synchronization clock signal.

2. The semiconductor memory device of claim 1, wherein the second internal clock generation circuit comprises:
a signal transfer line configured to transfer the first internal clock signal to be outputted as the second internal clock signal; and
a delay control unit configured to control a delay amount of the signal transfer line in response to the control voltage.

3. The semiconductor memory device of claim 1, wherein the control voltage has a waveform determined corresponding to the profile selection signal.

4. The semiconductor memory device of claim 1, wherein the control voltage has a voltage level changing in response to the profile selection signal.

5. The semiconductor memory device of claim 1, wherein the path selection signal is generated in response to an operation frequency of the semiconductor memory device.

6. The semiconductor memory device of claim 1, wherein the second internal clock generation circuit is activated in response to the path selection signal.

7. The semiconductor memory device of claim 1, wherein the selection output circuit is configured to output the first internal clock signal as the synchronization clock signal, at a first operation frequency of the semiconductor memory device, and output the second internal clock signal as the synchronization clock signal, at a second operation frequency that is higher than the first operation frequency.

8. The semiconductor memory device of claim 1, wherein the control voltage generation circuit comprises:
a variable resistance unit configured to vary a resistance value in response to the profile selection signal; and
an output unit configured to output the control voltage having a voltage level corresponding to the resistance value of the variable resistance unit.

9. The semiconductor memory device of claim 8, wherein the control voltage generation circuit further comprises:

a feedback unit configured to provide the control voltage back to the variable resistance unit.

10. The semiconductor memory device of claim 8, wherein the resistance value of the variable resistance unit corresponds to the voltage level of the control voltage.

11. The semiconductor memory device of claim 1, wherein the first internal clock generation circuit comprises a delay locked loop or a phase locked loop.

12. The semiconductor memory device of claim 1, wherein the control voltage comprises chopping wave swinging between voltage levels determined in response to the profile selection signal.

13. A clock generation circuit, comprising:
- a control voltage generation circuit configured to generate a control voltage changing in response to a profile selection signal; and
- a voltage controlled delay line configured to generate an internal clock signal by delaying a reference clock signal by a time corresponding to the control voltage,
wherein the control voltage generation circuit comprises:
- a variable resistance unit configured to vary a resistance value in response to the profile selection signal; and
- an output unit configured to output the control voltage having a voltage level corresponding to the resistance value of the variable resistance unit.

14. The clock generation circuit of claim 13, wherein the control voltage has a voltage level changing in response to the profile selection signal.

15. The clock generation circuit of claim 13, wherein the control voltage generation circuit further comprises:
a feedback unit configured provide the control voltage back to the variable resistance unit.

16. The clock generation circuit of claim 13, wherein the resistance value of the variable resistance unit corresponds to the voltage level of the control voltage.

17. The clock generation circuit of claim 13, wherein the voltage controlled delay line comprises:
- a signal transfer line configured to transfer the reference clock signal to be outputted as the internal clock signal; and
- a delay control unit configured to control a delay amount of the signal transfer line in response to the control voltage.

18. The clock generation circuit of claim 13, wherein the reference clock signal is generated by a delay locked loop or a phase locked loop.

19. The clock generation circuit of claim 13, wherein the control voltage comprises chopping wave swinging between voltage levels determined in response to the profile selection signal.

* * * * *